United States Patent [19]

Kwok et al.

[11] Patent Number: 5,271,972
[45] Date of Patent: Dec. 21, 1993

[54] METHOD FOR DEPOSITING OZONE/TEOS SILICON OXIDE FILMS OF REDUCED SURFACE SENSITIVITY

[75] Inventors: Kurt Kwok, Mountain View; Robert Robertson, Palo Alto, both of Calif.

[73] Assignee: Applied Materials, Inc., Santa Clara, Calif.

[21] Appl. No.: 930,121

[22] Filed: Aug. 17, 1992

[51] Int. Cl.$^5$ .................. B05D 3/06; C23C 16/00
[52] U.S. Cl. ......................... 427/579; 427/578; 427/255.3; 427/255.2; 427/255.1; 427/255; 427/255.7; 427/419.3
[58] Field of Search ............ 427/579, 578, 255.3, 427/255.2, 255.1, 255, 255.7, 419.3

[56] References Cited

U.S. PATENT DOCUMENTS 4,872,947 10/1989 Wang et al. .................. 156/643
4,987,005 1/1991 Suzuki et al. ................. 427/578

OTHER PUBLICATIONS

Fujino et al., J. Electrochem. Soc. vol. 138, No. 2 Feb. 1991 pp. 550–553.

*Primary Examiner*—Roy King
*Attorney, Agent, or Firm*—Birgit E. Morris

[57] ABSTRACT

A method of depositing good quality thermal CVD silicon oxide layers over a PECVD TEOS/oxygen silicon oxide layer comprising forming an interstitial layer by ramping down the power in the last few seconds of the PECVD deposition.

5 Claims, 2 Drawing Sheets

METHOD FOR DEPOSITING OZONE/TEOS SILICON OXIDE FILMS OF REDUCED SURFACE SENSITIVITY

This invention relates to an improved method of depositing silicon oxide More particularly, this invention relates to an improved method of depositing conformal thermal CVD silicon oxide layers on a plasma enhanced CVD silicon oxide substrate.

BACKGROUND OF THE INVENTION

In the manufacture of VLSI semiconductor devices, multilevel interconnects are made to increase the packing density of devices on a wafer. This also requires multilevel dielectric layers to be deposited between conductive layers. Such dielectric layers must have good step coverage and planarization properties to produce void-free layers that not only completely fill steps and openings in the underlying substrate, but also form smooth planarized dielectric layers. Further such dielectric layers must be able to be deposited at low temperatures, preferably below about 400° C., to avoid damage to underlying, already formed interconnects.

It is known that silicon oxide dielectric layers can be deposited with good conformality and planarization using tetraethylorthosilane (hereinafter TEOS), ozone and oxygen at comparatively low temperatures, e.g., about 375° C. These layers can be formed at atmospheric pressure and at slightly subatmospheric pressure These silicon oxide layers are referred to as thermal CVD silicon oxide layers. It is also known that the ratio of TEOS and ozone affects the film quality and deposition rate. For example, when depositing silicon oxide from TEOS and ozone using a high ozone:TEOS flow ratio, the rate of deposition is reduced, but the film quality is higher and conformality. i.e., the ability to produce void-free filling and planarized layers, is also higher. The layers provide good step coverage and good conformality which leads to excellent planarization, and excellent quality of the silicon oxide when deposited onto silicon.

However, when the thermal silicon oxide is deposited onto other silicon oxide layers, for example a plasma enhanced silicon oxide layer (PECVD) which can be deposited at high deposition rates, reduction in film quality has been noted. The quality of low temperature silicon oxide films from TEOS and ozone deposited onto PECVD silicon oxide is lower, and the wet etch rate of the thermal silicon oxide is high, which indicates poor quality films. Furthermore, the surface of the thermal silicon oxide is very rough and contains voids, indicating formation of a porous film.

Fujino et al, J. Electrochem. Soc. Vol 138, No. 2, Feb. 91, pp 550-553, have addressed this problem. Their solution is a two step thermal deposition process; first a deposit of silicon oxide using a low ozone concentration (0.5%) is put down, and a second layer deposited thereover using a high ozone concentration (5%). The result is said to be improved film quality of silicon oxide planarizing films.

However, this ozone-TEOS silicon oxide layer still has limitations in terms of poor surface quality and surface sensitivity. The higher the ozone:TEOS ratio, the greater the decrease in oxide deposition rate, and the greater the degradation in film properties, such as wet etch rate, wafer resistance and stress drift with time.

Bang et al in copending U.S. application Ser. No. 07/896,296 filed Jun. 10, 1992, have also addressed this problem; they developed a two step process which produced silicon oxide layers with reduced surface sensitivity and excellent film qualities and improved conformality of silicon oxide films to produce void-free films over submicron sized topography. This process comprises depositing a first seed layer of a nitrogen-doped PECVD TEOS silicon oxide and depositing thereover a second layer of silicon oxide in a non-plasma thermal process using high pressure and high ozone:TEOS flow ratios. However, this process requires two different gas streams. A method of achieving like results but without having to change deposition gas streams would be highly desirable.

SUMMARY OF THE INVENTION

A method of depositing silicon oxide from a plasma using TEOS and ozone as the plasma precursor gases which comprises a first, high deposition rate PECVD process using high pressure, high ozone:TEOS flow ratios, and for the last several seconds of deposition, stepwise reduction of the power to the reactor but without changing any other deposition reaction conditions. Surprisingly, this final reduced power deposition produces an interstitial silicon oxide layer having a surface onto which thermal CVD silicon oxide layers can be deposited having reduced surface sensitivity and excellent film qualities.

DETAILED DESCRIPTION OF THE INVENTION

Figure 1:
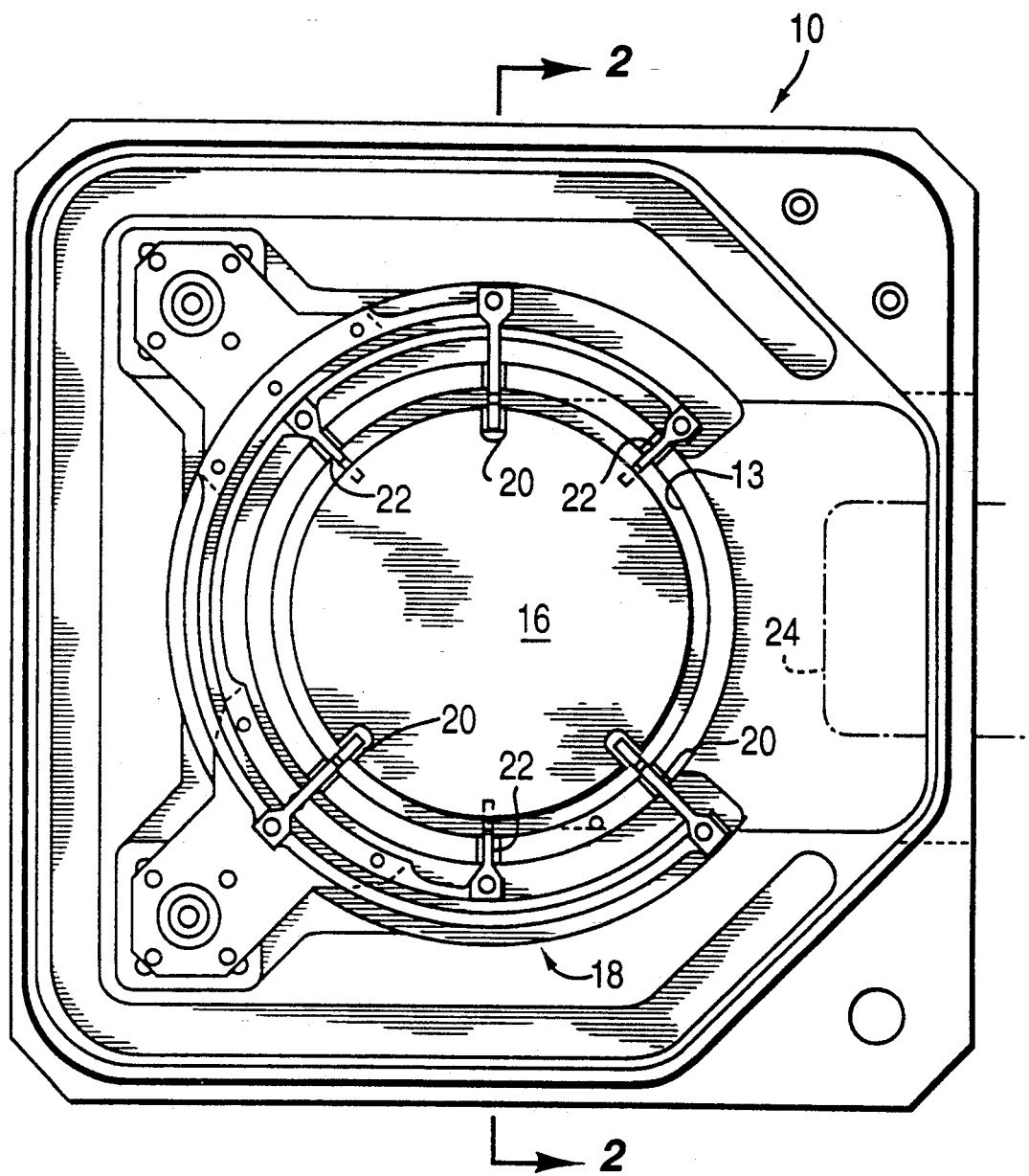
FIGS. 1 and 2 are a top plan view and a vertical cross sectional view respectively of a reactor suitable for carrying out the present process.

The silicon oxide layers deposited in accordance with the invention reduce or eliminate the surface sensitivity problem and the present process provides improved conformality and void-free gap filling capability to thermal CVD silicon oxide films, particularly when the silicon oxide is deposited over PECVD silicon oxide layers.

Surface sensitivity is manifested by a large decrease in deposition rate when thermal TEOS silicon oxide is deposited onto PECVD silicon oxide as compared to deposition onto silicon, particularly for a process utilizing a high ratio of ozone to TEOS, and degradation of film quality which is related to wet etch rate, moisture resistance and stress drift with time of the deposited films.

Although the exact reason for the surface sensitivity of thermal silicon oxide films deposited on PECVD silicon oxide is not known, applicants believe it is due to the presence of a hydrophilic surface on the PECVD grown silicon oxide. Since TEOS molecules are hydrophobic, the TEOS molecules are repelled by such hydrophilic surfaces, and the absorption rate of TEOS by the surface is reduced, with a consequent reduction in the deposition rate. Since silicon itself is hydrophobic, this would explain the higher deposition rate of thermal TEOS silicon oxide onto silicon as compared to the deposition rate of thermal CVD silicon oxide onto PECVD silicon oxide. Regardless of the reason for the improved results of the present process, the surface sensitivity of the deposited films is reduced by a very simple step, that of reducing the power during the final film deposition. In effect the reduced power-deposited PECVD silicon oxide forms a different, interstitial film of silicon oxide. It is presently believed this film is a tensile film that modifies the surface of the PECVD silicon oxide layer, making it less hydrophilic. Thus the second thermal CVD silicon oxide layer exhibits reduced surface sensitivity and improved film quality. This process is accomplished using the same prior known reaction conditions and gas precursor mixtures except for the power applied, which eliminates any need for a separate reaction chamber or changing reaction gases or conditions. Thus the PECVD silicon oxide layer, the interstitial silicon oxide films and the thermal CVD silicon oxide layer can be deposited in the same reactor, using known gases, simply by controllably reducing the power at the end of the PECVD deposition, and then continuing with a thermal CVD deposition with the power off In accordance with the preferred embodiment of the invention, a PECVD process is carried out on the substrate. The PECVD oxide deposition process uses a plasma formed from TEOS, oxygen and a carrier gas, which can contain a helium diluent. This process uses a deposition chamber pressure of about 1-50 torr, preferably about 8.2 torr, an oxygen flow rate of about 100-1000 sccm, an inert carrier gas flow rate of about 100-1500 sccm, and RF power to a six inch diameter gas distributer cathode of about 200-400 watts. Power density at the gas distributor cathode is about 200-400 watts., or about 1 watt/cm$^2$. The temperature of deposition is about 300°-500° C., preferably about 375° C. This process is described in greater detail in U.S. Pat. No. 4,872,947. During the last few seconds of deposition, the power is controllably reduced in at least two steps; first to a level of below about 80% to about 55% of the initial power; and further reducing the power to a level of about 45-10% of power for an additional period. Preferably, the power is reduced in three stages; first to a level of about 80-65% of power for about 2 seconds; secondly to a level of about 50-35% of power for about 2 seconds; and lastly to a level of about 30-10% of power for a final 2 seconds. A maximum deposition period of about 8 seconds is employed for deposition of the reduced power interstitial silicon oxide layers. This gradual reduction of power produces silicon oxide layers having reduced surface sensitivity for overlying thermal CVD silicon oxide layers.

Figure 2:
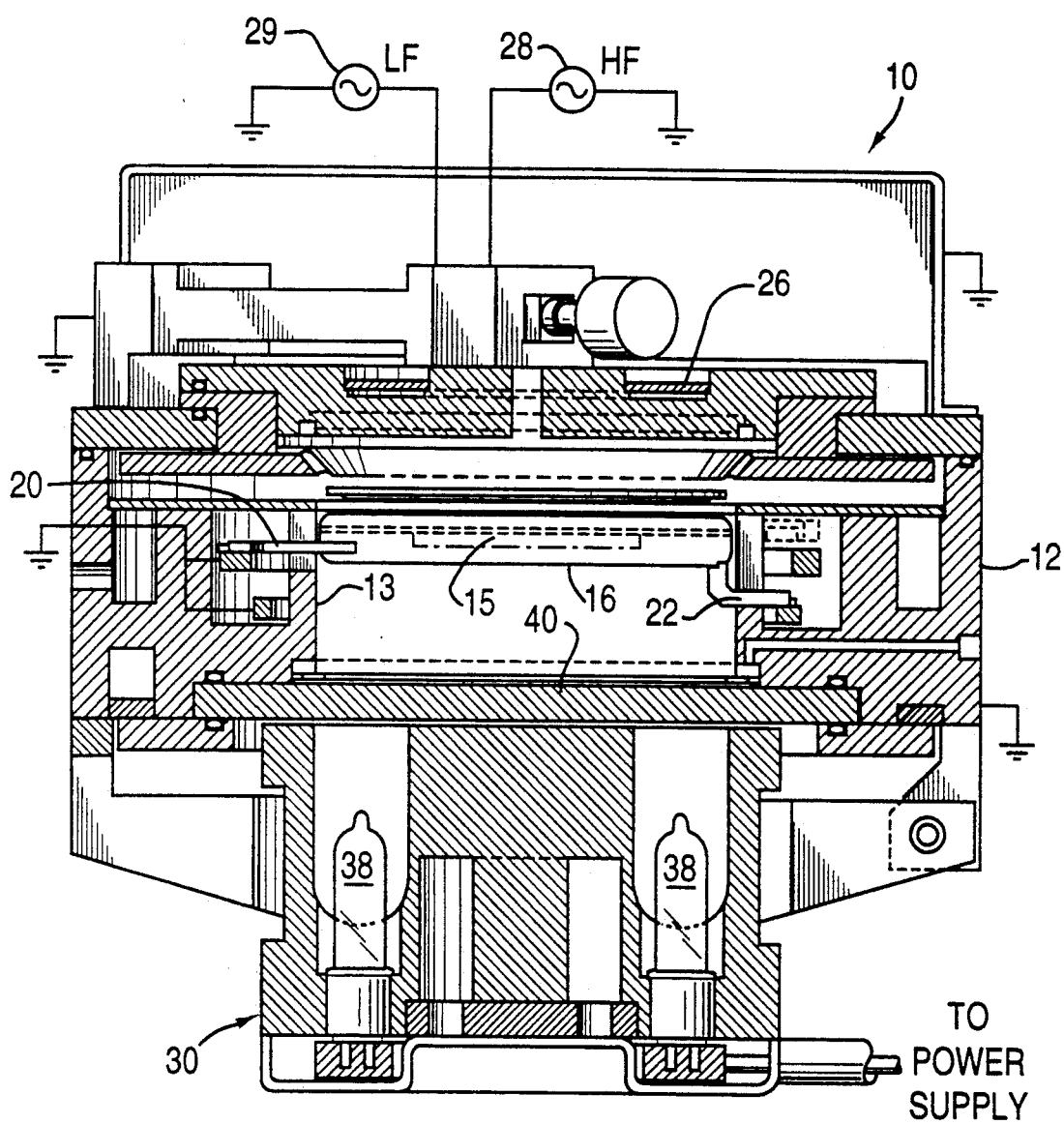

A suitable CVD/PECVD reactor in which the present process can be carried out is described in U.S. Pat. No. 4,872,947 to Chang et al assigned to Applied Materials, Inc, the assignee of the present invention. A top plan view an a vertical cross sectional view of a suitable reactor are shown in FIGS. 1 and 2.

A reactor system 10 comprises a vessel 12 that defines an inner vacuum chamber 13 that has a plasma processing region 14. The reactor system 10 also includes a susceptor 16 for holding the substrate and a substrate transport system 18 that includes vertically movable substrate support fingers 20 and susceptor support fingers 22. These fingers cooperate with an external robotic blade 24 for introducing substrates 15 into the chamber 13 and depositing the substrates 15 on the susceptor 16 for processing and thereafter removing the substrates 15 from the susceptor 16 and the chamber 13. The reactor system 10 further comprises a process/-purge gas manifold 26 that applied process gas and purging gas to the chamber 13; a high frequency RF power supply and matching network 28, and a low frequency RF power supply and matching network 29 for creating and sustaining a process gas plasma from the inlet gas; and a lamp heating system 30 for heating the susceptor 16 and substrate 15 positioned on the susceptor 16 to effect deposition onto the substrate 15. High frequency RF power (13.56 MHz) can be employed, or lower RF frequencies (100-450 KHz) can also be used, or a mixture of high and low frequencies can be used to generate a plasma from the process gases.

A gas manifold 26 supplies process gases to the chamber 13. The gas manifold 26 distributes the process gases evenly radially outwardly across the substrate 15 to promote even deposition across the substrate 15, and can include a RF/gas feed-through device 36 that supplies process gas to the gas manifold 26 that is RF driven. This ensures a high degree of plasma confinement between the manifold 26 and the substrate 15, situate on the susceptor 16 which is grounded.

A radiant heating system comprises an array of vertically oriented quartz-tungsten-halogen lamps 38 outside the chamber 13 which provide radiant heat to the susceptor 16 and the substrate 15 through a quartz window 40 in the chamber 13. Further details of the PECVD reactor are given in U.S. Pat. No. 4,872,947, incorporated herein by reference. Deposition of silicon oxide films can be deposited using standard high frequency RF power or a mixed frequency RF power can be used.

The PECVD silicon oxide layer is generally deposited at a power level of the reactor of about 5 to 10 watts/cm$^2$ of the substrate, preferably about 7 watts/cm$^2$. During the final few seconds of deposition, for example. the power can be stepwise reduced to about 5 watts/cm$^2$, then reduced to about 3 watts/cm$^2$ and finally to about 1 watt/cm$^2$, over a period of a few seconds. This process is reproducible and reliable.

Since the basic gas chemistry is the same for deposition of both the PECVD silicon oxide and the thermal CVD silicon oxide layers, the same chamber can be used for both processes by simply deactivating the RF power for the thermal CVD silicon oxide deposition.

After the PECVD silicon oxide and reduced power interstitial silicon oxide layers have been deposited, a thermal, conformal silicon oxide can now be deposited that is of high quality and that does not exhibit the surface sensitivity of thermal CVD silicon oxide.

The thermal CVD process uses a gas stream of TEOS, oxygen and ozone at fairly high pressures of over 10 torr, preferably from about 500 and 760 torr, and at substrate temperatures of about 375° C. A highly conformal silicon oxide layer is deposited that fills in stepped topographies on a silicon dioxide surface at a rapid deposition rate.

The present process is highly advantageous because the first PECVD silicon oxide layer, the interstitial low power silicon oxide layers, and the final thermal CVD silicon oxide can be deposited in sequence, in the same reaction chamber, requiring a minimum of changes in the reactor, and without having to remove the substrate from the reaction chamber between deposition of the various layers. The chamber temperature and gas flow rates remain constant during the PECVD depositions while the power levels of the RF source is reduced controllably and rapidly. It need take only about 6 seconds to deposit interstitial layers that reduce the surface sensitivity of the final thermal CVD silicon oxide layer.

Various changes to the gas mixtures, temperature and pressure of the reactions are contemplated and are meant to be included herein. The invention is only meant to be limited to the scope of the appended claims.

We claim:

1. A process for depositing a plasma enhanced CVD (PECVD) silicon oxide layer on a substrate in a reactor comprising:
   a) depositing a PECVD silicon oxide layer from a plasma of tenaethylorthosilane (TEOS) and oxygen at a power level of about 5-10 watts per square centimeter on a semiconductor substrate,
   b) reducing the power while maintaining the TEOS and oxygen gas flows in the reactor, thereby forming an intermediate PECVD silicon oxide layer on the PECVD silicon oxide layer and
   c) depositing a thermal CVD silicon oxide layer on the intermediate PECVD silicon oxide layer by a thermal chemical vapor deposition process from a precursor gas mixture of TEOS, ozone and oxygen, so that the overlying thermal CVD silicon oxide layer has less surface sensitivity due to the presence of the intermediate PECVD silicon oxide layer.

2. A process according to claim 1 wherein the power used in step a) is reduced in a first stage to about 80-55% of said power and in a second stage to about 45-10% of said power.

3. A process according to claim 1 wherein the power used in step a) is reduced in a first stage to about 80-65% of said power, in a second stage to about 50-35% of said power and in a final stage to about 30-10% of said power.

4. A process according to claim 1 wherein step b) is continued for a maximum of about 8 seconds.

5. A process according to claim 3 wherein each stage is carried out for about 2 seconds.

* * * * *